United States Patent [19]

Ackerman

[11] Patent Number: 4,654,593
[45] Date of Patent: Mar. 31, 1987

[54] METHOD FOR CHEMICAL AND TOMOGRAPHIC ANALYSIS OF A MOVING OBJECT BY NUCLEAR MAGNETIC RESONANCE

[75] Inventor: Jerome L. Ackerman, Cincinnati, Ohio

[73] Assignee: University of Cincinnati, Cincinnati, Ohio

[21] Appl. No.: 701,206

[22] Filed: Feb. 13, 1985

[51] Int. Cl.$^4$ .............................................. G01R 33/20
[52] U.S. Cl. ...................................... 324/307; 324/309
[58] Field of Search ............... 324/300, 306, 307, 309, 324/311, 318, 321

[56] References Cited

U.S. PATENT DOCUMENTS 4,319,190  3/1982  Brown ................................. 324/309
4,506,222  3/1985  Edelstein et al. .................... 324/309

OTHER PUBLICATIONS

Pembleton et al., "NMR Probe for Combined Homonuclear Multiple Pulse Decoupling and Magic Angle Spinning", Review of Scientific Instruments, vol. 48, No. 10, Oct. 1977.

*Primary Examiner*—Stewart J. Levy
*Assistant Examiner*—Kevin D. O'Shea
*Attorney, Agent, or Firm*—Frost & Jacobs

[57] ABSTRACT

A method for non-destructive chemical and tomographic structural analysis of an object by nuclear magnetic resonance wherein a nonmagnetic object which is substantially transparent to electromagnetic radiation at the nuclear magnetic resonance frequency is subjected to periodic motion while transverse magnetization is generated, subjected to at least one magnetic field gradient pulse of sufficiently short duration that the object does not move appreciably while the pulse is on, and a resulting free induction decay signal is detected, collected in a computer and processed by Fourier transformation to obtain the chemical shift spectrum at various positions within the object.

26 Claims, No Drawings

METHOD FOR CHEMICAL AND TOMOGRAPHIC ANALYSIS OF A MOVING OBJECT BY NUCLEAR MAGNETIC RESONANCE

BACKGROUND OF THE INVENTION

This invention relates to the application of nuclear magnetic resonance (NMR) imaging (tomography) to simultaneous, non-destructive chemical and structural analysis of an object or sample while it is subjected to rotational or other periodic motion. Although not so limited, the invention has particular utility in the analysis of solid objects. NMR spectroscopy can provide great specificity in chemical analysis, in addition to information on molecular motions and physical states. A combination of NMR spectroscopy with imaging in solid samples makes possible a wide variety of applications in industry, medicine and biology, such as analysis of fabricated ceramic or polymeric parts, and imaging of phosphorus in bone. The method of this invention as applied to a rotating liquid sample makes possible the improved separation and analysis of protein mixtures.

The use of NMR in chemical analysis of liquid samples is a well established art. E. D. Becker, "High Resolution NMR, " 2nd edition, Academic Press, New York, 1980, provides a good review of the subject and of numerous variations in NMR techniques for liquid samples. In general, the liquid sample is placed in the static magnetic field of the instrument. All magnetic nuclei (those possessing spin angular momentum—there is at least one such isotope for every chemical element) of the sample will display a tendency to align with the field. One or more radiofrequency (RF) pulses applied to the sample via the inductance of a tuned electrical circuit will cause the net magnetization of one such isotope to be nutated to a direction transverse to the field. This transverse magnetization will precess about the field direction at a nominal frequency (the Larmor frequency) characteristic of the isotope and proportional to the strength of the field. (The radiofrequency must be near the Larmor frequency for the RF pulses to have substantial effect.) For example protons (the most common nuclear isotope of hydrogen) will precess at about 42.57 MHz in a field of 1.0 Tesla (10,000 gauss). Chemical information is obtained primarily by measuring the small frequency shifts in Larmor frequency which are caused by differences in the shielding of the nuclei from the field by the molecular environment of nuclei. This effect is called the chemical shielding or chemical shift, and is typically displayed as a frequency spectrum of intensity of signal versus frequency or chemical shift. Thus, with respect to a certain reference compound, e.g., tetramethylsilane, protons in a methyl group are typically shifted about one part per million (ppm) in frequency downfield (equivalent to higher frequency), while methylene protons are shifted about two ppm downfield. The detection and measurement process is actually comprised of detecting the RF voltage induced in the tuned circuit by the precessing magnetization as it decays to its unperturbed state (the "free induction decay" or FID), digitizing the FID signal, and performing a Fourier transform operation on the signal with a computer to obtain the frequency spectrum.

The term "spectrosocopy" will be used to imply measuring frequency spectra with primary emphasis on such chemical information, as distinct from the term "imaging", which will refer primarily to spatial information content. An FID signal may contain both spectroscopic and imaging information.

Analysis of solid samples by NMR spectroscopy is through analogous means, although complications in the physics of nuclear magnetic moments in solids creates unusual demands on the instruments and requires special NMR techniques. For this reason, solid state NMR is not nearly as widely applied as is liquid state NMR. Reviews of NMR spectroscopy of solids include:

M. Mehring, "High Resolution NMR Spectrosocopy in Solids," number 11 in "NMR—Basic Principles and Progress," Springer-Verlag, Berlin, 1976; also 2nd edition, 1983.

U. H. Haeberlen, "High Resolution NMR in Solids: Selective Averaging," supplement 1 in "Advances in Magnetic Resonance," Academic Press, N.Y., 1976.

Some specific NMR methods for solids are disclosed in:

U.S. Pat. No. 3,474,329, issued Oct. 21, 1969 to J. S. Waugh.

U.S. Pat. No. 3,530,373, issued Sept. 22, 1970 to J. S. Waugh.

U.S. Pat. No. 3,530,374, issued Sept. 22, 1970 to U. H. Haeberlen & J. S. Waugh.

U.S. Pat. No. 3,792,346, issued Feb. 12, 1974 to M. G. Gibby et al.

One such complication in solid state NMR is the fact that chemical shielding is anisotropic; it varies with the orientation of the molecule in the magnetic field. Thus, in a polycrystalline solid containing all orientations, a single chemical group displays a wide range of shielding values. (The rapid, random molecular motion in liquids causes an averaging of these values to a single value, and in fact makes possible the simplicity of liquid NMR.) The anisotropy of many such nuclear interactions may be, in effect, removed with the technique of "magic angle spinning" in which the sample is rapidly rotated (at a rate on the order of 1 to 4 kHz) about an axis inclined to the magnetic field direction at an angle of 54.7° (the "magic" angle). This produces an averaging process which is mathematically equivalent to the averaging caused by moleclar motion. The magic angle technique for averaging of direct spin-spin (direct dipolar) interactions in solids was disclosed by I. J. Lowe in *Free Induction Decays of Rotating Solids*, Physical Review Letters 2, 285-287 (1959), and for quadrupolar interactions by Andrew, Bradbury and Eades, *Archives of Science*. Geneva 11, 223 (1958).

The above-mentioned U.S. Pat. No. 3,474,329 discloses NMR apparatus which is programmed to produce RF excitation energy the amplitude and phase of which are such that the effects of spin-spin interactions are averaged to a reduced value. Resonance shifts, although also affected, can still be observed in the output signal. It is stated that the method of operation of such apparatus is useful for solids whose dipolar interactions are large. The method comprises adapting a coherent RF modulator in a pulsed NMR apparatus to provide a particular sequence of phase modulated pulses, or to provide a phase and amplitude modulated continuous wave RF excitation.

The above-mentioned U.S. Pat. Nos. 3,530,373 and 3,530,374 disclose NMR apparatus and a method of operation thereof stated to be useful for solids whose resonance shifts and electron coupled spin-spin interactions are smaller than would otherwise be obscured by static nuclear magnetic dipole-dipole interactions and- /or quadrupolar interactions. The method of these patents involves adapting a coherent RF modulator in a pulsed NMR apparatus to provide a particular sequence of phase modulated RF pulses, or a phase modulated RF pulse in conjunction with a video pulse.

U.S. Pat. No. 3,792,346 discloses a method for detecting nuclear magnetic and/or electric quadrupole resonance frequencies of isotopically rare or chemically dilute nuclei in the presence of one or more abundant nuclear spin species in solid samples. The free induction decay (FID) of the dilute nuclei is directly detected after an applied RF field at the Larmor frequency of the dilute nuclei is removed. A high resolution FID of the dilute nuclei is obtained by applying an RF field at the Larmor frequency of the abundant spin system during the detection interval.

In *Nature*, 242, 190 (1973), P. Lauterbur disclosed the detection of spatial distributions of spin densities and/or relaxation times using high-resolution NMR procedures in combination with magnetic field gradients for localized liquid regions in biological systems. This has led to widespread use of NMR tomography in diagnostic radiology and similar medical applications, all relating to liquid-like materials.

It should be noted that, for the purposes of NMR analysis, a "liquid" sample is one in which the anisotropy of interactions such as the chemical shift has been substantially averaged by molecular motion. In this context, most components of living tissues are liquid, irrespective of the gross physical characteristics of the tissues. Other components, most notably the mineral phase of bone and teeth, but also certain rigid structural proteins and cell membranes are "solid" in the NMR context.

Another method for producing NMR images of liquid-like components of an object was disclosed by A. Kumar, D. Welti and R. R. Ernst in "NMR Fourier Zeugmatography", *Journal of Magnetic Resonance* 18, 69–83 (1975). In this method, magnetic field gradient pulses are applied to the object before and during acquisition by computer of the NMR FID signals from the object. In successive acquisitions of the FID signals, some of the field gradients are sequentially incremented in intensity or time duration. Reconstruction of the image requires use of the Fourier transform operation.

As in all methods of NMR imaging, these methods produce encoding of spatial information in the FID through the use of spatially varying magnetic fields (for instance linear gradients of the static magnetic field). Lauterbur's method is generally known as "projection reconstruction" or "zeugmatography," while Kumar, Welti and Ernst's method is generally known as "Fourier imaging". Many NMR imaging methods in current use contain elements of both methods.

NMR imaging of solids has received little attention in comparison to the studies devoted to NMR procedures for medical applications. Other publications relating to NMR imaging of solids of which applicant is aware include the following:

P. Mansfield and P. K. Grannell, *"Diffraction" and Microscopy in Solids and Liquids by NMR*, Physical Review B, Vol. 12, No. 9, 3688–3634 (1975).

R. A. Wind and C. S. Yannoni, *Selective Spin Imaging in Solids*, Journal of Magnetic Resonance 36, 269–272 (1979).

U.S. Pat. No. 4,301,410, issued Nov. 17, 1981 to R. A. Wind and C. S. Yannoni.

N. M. Szeverenyi and G. E. Maciel, *NMR Spin Imaging of Magnetically Dilute Nuclei in Solid State NMR*, Journal of Magnetic Resonance 60, 460–466 (1984).

W. P. Rothwell, D. R. Holecek and J. A. Kershaw, *NMR Imaging: Study of Fluid Absorption by Polymer Composites*, Journal of Polymer Science: Polymer Letters Edition 22, 241–247 (1984).

A. N. Garroway, J. Baum, M. G. Munowitz and A. Pines, *NMR Imaging in Solids by Multiple-Quantum Resonance*, Journal of Magnetic Resonance 60, 337–341 (1984).

The Mansfield and Grannell article contains various equations, calculations derived therefrom and experimental results in ordered and disordered systems, using either multiple-pulse line-narrowing sequences or single pulses, together with an applied linear magnetic field gradient.

In solid samples where multiple pulse line narrowing techniques are required, it is concluded that a spatial resolution limit of 4 $\mu$m in a 100$\mu$m thick sample is achievable, or about 25 pixels (picture elements) in a single dimension. The resolution limit is determined by the linewidth achievable by the multiple pulse sequence, the efficiency of which degrades as the intensity of the magnetic field gradient is increased in an attempt to improve the spatial resolution.

The article by Wind and Yannoni reports selective spin imaging in solids. It is pointed out that in solids the problem of resolution is difficult to overcome because the natural linewidth usually caused by static dipolar interactions is about 10 to 50 kHz. For a resolution of 0.5 mm this would require gradients varying from 0.2 to 1 MHz/cm which are difficult to obtain, especially for larger objects. The solution to the problem resides in the application of line-narrowing techniques wherein the dipolar broadening can be reduced by a factor of 100 to 400. The method applied by the authors involved a combination of RF irradiation and field modulation for line-narrowing. Line narrowing was obtained for specific values of the RF amplitude, modulation frequency and index, and the offset from resonance. A train of identical RF pulses with equal spacings was used, and the field modulation was replaced by frequency modulation. It was found that line-narrowing could be obtained for many values of the different parameters. The method of line narrowing used here is rather specific to the nucleus and compound studied. More strongly dipolar coupled solids would not narrow as well. The method is very time-consuming, since data for only one position along a field gradient are acquired in any FID.

The above mentioned U.S. Pat. No. 4,301,410 discloses a method of spin imaging in solids using NMR, wherein a solid sample within the field of an RF excitation coil and the static external magnetic field of an NMR spectrometer is rotated about an axis which makes an angle of 54.7° with the direction of the static external magnetic field. A specific magnetic field gradient is superimposed in one direction on the static external magnetic field in order to provide different resonant NMR frequencies in different parts of the sample, and the magnetic field gradient is rotated synchronously with the sample. Solid state NMR line narrowing procedures must be applied while collecting data. The phase relation is changed between the sample rotation and the field gradient rotation on a step-by-step basis, with data being collected each time, and the spin image of the solid sample is then reconstructed.

The NMR line narrowing procedures are stated to be those disclosed in the above-mentioned U.S. Pat. Nos. 3,530,373; 3,530,374; 3,474,329 and 3,792,346. In addition, the step of spinning the sample around an axis of 54.7° with the static external magnetic field (the so-called "magic angle") is also stated to remove other broadening effects not removed by the procedures disclosed in these four U.S. patents.

The method of U.S. Pat. No. 4,301,410 thus involves magic angle spinning (MAS) with a synchronously rotating magnetic field gradient, during which data are collected while performing solid state NMR line narrowing procedures, in a variety of different phase relations between the sample rotation and the field gradient rotation. This patent alleges that the method is advantageous in extending spin imaging in solids by NMR to a wider class of materials, although no specific examples or other data are disclosed.

The Szeverenyi and Maciel article discloses a method of NMR imaging of carbon in solids. Some line narrowing is achieved by proton decoupling. The samples chosen for study all have unusually narrow carbon NMR lines. This method would be difficult to use or impractical in the general case. It also does not allow resolution of chemical shift information.

The article by Rothwell, et al., describes NMR imaging of a polymer composite sample. Although the sample is solid in outward appearance, these authors have not in fact imaged the solid, but rather liquid water which has penetrated the solid.

The article by Garroway, et al., employs multiple quantum coherence to magnify the effect of a magnetic field gradient to an extent which is sufficiently intense that it overcomes the natural linewidth of a dipolar coupled solid. This method can only work with homonuclear dipole coupled spin systems (or the equivalent quadrupolar coupled spins). It was demonstrated for one sample which has properties convenient for the experiment, and may be very difficult to carry out for a general substance. It is also not capable of chemical shift resolution in more complicated substances.

The present state of the art, with respect to imaging of solid objects by NMR procedures, has not yet made it possible to obtain high spatial resolution imaging of solid objects nor to obtain a chemical image of solid objects. Insofar as other types of imaging are concerned using X-rays, radioisotopes, or ultrasound, it is not possible to derive specific information on chemical composition throughout the object.

There are several methods of obtaining "chemical images" in liquids, i.e., images of specific chemical components as determined by their chemical shift spectra. The one most closely related to this invention is disclosed in U.S. Pat. No. 4,319 190, issued Mar. 9, 1982 to Truman R. Brown. In this method, spatial information is encoded in the FID using magnetic field gradient pulses as in Fourier imaging. All magnetic field gradients are off during acquisition of the FID, which therefore evolves during the acquisition period only according to the chemical shift spectrum. Fourier transformation over each spatial dimension encoded and over the chemical shift dimension produces the chemical shift spectrum for each pixel (picture element) in the spatial image. As disclosed, this method will not in general work for solids, because it does not deal with the broad lines characteristic of solids.

With respect to the use of an ultracentrifuge in combination with optical detection, wherein light is directed through a quartz sample cell as it passes periodically between the source and detector in the ultracentrifuge, there is a need for detection in solutions which are not sufficiently transparent to the wavelength of light used in optical detection, and for detection where refractive index or absorption coefficient variations are too small to be distinguished. In addition, chemical composition which can be obtained, e.g. by ultraviolet wavelengths, is relatively nonspecific.

SUMMARY OF THE INVENTION

It is an object of the present invention to provide a method for simultaneous chemical and structural analysis of an object by NMR imaging which fulfills the needs set forth above and avoids the disadvantages of prior art procedures.

According to the invention there is provided a method for non-destructive chemical and tomographic structural analysis of a moving object by NMR, comprising the steps of:

(a) positioning a substantially nonmagnetic object to be analyzed within the field of a radio frequency excitation coil and the magnetic field of a nuclear resonance spectrometer, said object being of sufficiently low conductivity at the nuclear magnetic resonance frequency as to be substantially transparent to electromagnetic radiation of that frequency;

(b) subjecting said object to periodic motion;

(c) generating a transverse magnetic moment of the nucleus being observed, said generation being performed in a manner appropriate to the chemical and physical character of the object;

(d) applying at least one phase-encoding magnetic field gradient pulse in at least one specified direction to said moving object of sufficiently short duration that said object does not move appreciably while said pulse is on;

(e) turning off said magnetic field gradient and detecting a free induction decay signal;

(f) collecting said signal in a computer:

(g) repeating steps (c), (d), (e) and (f) with appropriate increments in the intensities of the field gradient pulses in the manner of Fourier imaging, and at times corresponding to the same original position in the object; and (h) processing said signals by Fourier transformation whereby to obtain the chemical shift spectrum at various positions within the object.

In the preferred practice of the invention the periodic motion is rotation about an axis of the object at a rate of about 1 to about 5 kHz. However, any speed which achieves useful line narrowing is within the scope of the invention. This of course requires that any object to be imaged must have sufficient mechanical balance about the axis of rotation and sufficient mechanical strength to withstand spinning at high speed. Other types of periodic motion which may be used include pulsatile, vortical, oscillatory or constant flow motions.

In the case of a substantially liquid sample, a 90° pulse would be the preferred method of generating a transverse magnetization. In the case of a solid sample in which dilute nuclei are being imaged, a cross polarization sequence would be the preferred method of generating and observing a transverse magnetization, and the preferred orientation of the axis of rotation would be 54.7° (the magic angle) from the static magnetic field direction. In the case of a solid sample in which strongly homonuclear coupled nuclei are being observed, the preferred observation method would include a line-narrowing RF pulse sequence and the preferred orientation of the axis of rotation would be 54.7° (the magic angle) from the static magnetic field.

It is considered that animal tissues and other biological samples are sufficiently transparent to the NMR radiofrequency radiation to be used as the subject of analysis, even though they may exhibit significant absorption of RF power at the higher frequencies used in NMR instrumentation.

DETAILED DESCRIPTION

The use of field gradient pulses which are sufficiently short in duration that the object does not move significantly while the pulses are on is analogous to the use of a sufficiently fast shutter speed to "stop" the motion of an object being photographed, or to the action of stroboscopic light. The length of time which may be used for the pulses depends upon such factors as the amount of "blurring" which can be tolerated in the image. Chemical specificity in the image can be obtained in the present method by reason of the fact that acquisition of NMR signals occurs when all the magnetic field gradients are turned off. This is a significant distinction over, e.g., the method of the above-mentioned U.S. Pat. No. 4,301,410.

In one embodiment of the process of the invention an RF and magnetic field gradient pulse sequence generates a two-dimensional chemical image, i.e., a chemical shift spectrum for each point in a rectangular grid transverse to the axis of rotation of a rotating object.

In such an embodiment, at the start of the pulse sequence, a nonselective 90° RF pulse is applied to the object, generating transverse magnetization. A field gradient pulse is then applied immediately in a direction transverse both to the rotation axis and the magnetic field direction. This produces an evolution in phase of the FID according to the position of each nuclear spin in the sample (phase encoding).

The duration of the field gradient pulse is much shorter than the rotation period. After the object has rotated 90°, a second gradient pulse is applied from the same coil, preferably of the same duration, and a similar evolution of magnetization is produced, but with respect to a perpendicular direction in the sample. The subsequent free induction decay (FID) signal is detected and collected by the computer of the NMR spectrometer. This process is repeated for all independent combinations of linear increments in field gradient pulse amplitudes. The resultant data set is equivalent to that which would have been collected in a 2D Fourier chemical image of a non-rotating object using two orthogonal field gradient coils, and may be similarly processed by 3D Fourier transformation.

The use of only one magnetic field gradient coil to produce phase encoding in two orthogonal directions in the sample, although not essential to the method, makes use of the rotation of the sample, thereby eliminating the need for a second gradient coil and amplifier. The method of this embodiment produces a projective image, i.e., one which is a projection of the entire volume of the sample parallel to the rotation axis onto a single plane transverse to the axis.

An alternative procedure involves application of a selection field gradient parallel to the rotation axis, combined with a selective 90° RF pulse in place of the non-selective 90° RF pulse of the above-described sequence.

This method prepares transverse magnetization from a thin slice of the sample perpendicular to the rotation axis at the position where the RF pulse is on resonance with the spins. At the termination of the pulse, the selection gradient is reversed to refocus magnetization dephased during the pulse. Then the procedure is continued as in step (d) above.

In another alternative, the addition of a third dimension of imaging, parallel to the axis of rotation, is effected by adding another field gradient pulse parallel to the rotation axis at about the same time as the application of one of the magnetic field gradient pulses in a direction transverse to the rotation axis. Data would be collected for all independent linear increments in the three field gradient pulse amplitudes, requiring a 4D Fourier transformation.

In another variation, applicable when the rotation axis angle is the magic angle, all three spatial dimensions may be encoded using a single magnetic field gradient coil oriented at the magic angle with respect to the rotation axis. One such, direction is the static magnetic field direction. A magnetic field gradient pulse is applied to the sample. The sample is then rotated 120° and another magnetic field gradient pulse is applied to the sample. The sample is again rotated 120° and another pulse applied. This results in encoding the three spatial dimensions of the sample by obtaining the data at these three orthogonal directions in the sample. The spatial geometry of this situation is more clearly understood by consideration of the direction of the applied gradient pulses in a coordinate system fixed with respect to the rotating sample which can be through of as a cube oriented such that the internal diagonal of the cube is on the axis of rotation of the sample. One of the vertices of the cube which lies on the axis of rotation defines the origin of the sample-fixed coordinate system, and the three sides of the cube which join at the vertex define the x, y and z axes of the coordinate system. The angle between any one of these coordinate axes and the axis of rotation must be solid geometry be 54.7°, and the dihedral angle between any two planes containing the axis of rotation and a cooridnate axis must be 120°. The direction of the first gradient pulse with respect to the sample-fixed coordinate system may be used to define the x axis of this coordinate system. Then the second and third pulses, although being along the same direction as the first in the laboratory-fixed coordinate system, will occur along the y and z axes of the sample-fixed coordinate system.

Conventional apparatus is capable of producing field gradient pulses of sufficient amplitude over a sample volume of a few cubic centimeters which have a duration of about 10 to about 20 microseconds, and pulses of this duration can be utilized in the present process when the object is rotated about its axis at a rate of about 1 to 5 kHz.

The amount of blurring using these values varies from 3.6 degrees to 36 degrees. Blurring could be reduced with slower rotation rates.

Another alternative is introduction of a 180° RF pulse just after all field gradient pulses, which causes refocusing of any chemical shift evolution occurring during and between the field gradient pulses. Acquisition of computer data would then start at the maximum in the resulting spin echo, which would eliminate any phase distortion caused by the chemical shift evolution.

It will be understood that the usual criteria for an object to be susceptible to NMR analysis are applicable, namely that the object must be essentially non-magnetic, and must have sufficiently low conductivity at the NMR frequency that it is substantially transparent to electromagnetic radiation of that frequency. Where chemical imaging is to be conducted, the chosen isotope and the chemical constituent must be present in sufficient quantity and/or concentration to provide a reasonable NMR signal intensity.

As is well known, the ultracentrifuge is widely used in the analysis and separation of macromolecules on the basis of their sizes. In this procedure a fluid sample positioned a few centimeters from the axis of the instrument is spun at high speed, producing great acceleration, typically several hundred thousand g's. Rotational speeds of several tens of thousands of RPM are used.

Under certain conditions of centrifuging, a solute in an initially uniformly mixed solution will redistribute itself in the radial direction to form a distribution in concentration, tending to sediment toward the outside of the orbiting sample if it is more dense than the solvent. It is possible to completely "spin down" the solute, achieving a separation from the remainder of the solution. Generally, when the molecular weight of a solute in solution is to be determined, a complete separation is not performed. In an equilibrium sedimentation measurement, the concentration profile of a solute in a solution is measured under intermediate acceleration. In the sedimentation velocity method, the sedimentation rate of an initially uniform solution, or of a band of solution initially layered on top of a more dense solvent, is measured. This sedimentation velocity may be used to calculate the molecular weight if the diffusion constant and density increment of the solute are known.

In all these applications, it is necessary to measure the concentration of the solute as a function of the radial distance from the rotation axis. This measurement must be performed while the sample is spinning, so that only a non-contact measurement can be used. The existing methods rely on optical phenomena, such as refractive index variations along the sample radius or the measurement of optical absorbance, generally at ultraviolet wavelengths. Refractive index measurements provide no information on the chemical constitution of the solute. UV absorption spectroscopy can provide some information on chemical composition of a solute, but it is relatively non-specific.

The NMR spectrometer and procedure conventionally used are unsuitable for use in detection in an ultracentrifuge. Conversely, the ultracentrifuge as normally operated makes NMR detection impossible.

However, the previously mentioned magic angle spinning (MAS) technique disclosed in Lowe, *Physical Review Letters*, provides centrifugal accelerations which are comparable to or can even exceed those attainable in conventional ultracentrifuges. Thus, the method of the present invention, wherein liquid samples are spun in cylindrical containers having a diameter of about 1 cm, can be utilized to obtain determinations of the type normally measured in a centrifuge and additionally to obtain partial or full chemical identification of sedimenting components.

Accordingly, in the method of the present invention, an NMR spinner can be utilized in the same manner as an ultracentrifuge, and the rotor spinning axis can be oriented at any acute angle with respect to the magnetic field. In a typical NMR spinner rotating at about 4.5 kHz and a maximum radius of 0.5 cm, an acceleration of $4.1 \times 10_5$ g is obtained. This corresponds approximately to accelerations of about $4.0 \times 10_5$ g in a conventional ultracentrifuge.

In the use of NMR detection with a high speed spinner, a way of making the NMR measurements specific to the various positions along the sample radius is needed. This is effected through NMR imaging in two dimensions by the above-described method in appropriately designed sequences applied to the rotating sample. This will thus provide NMR spectra for sequential radial positions in the sample, i.e. the chemical image thereof.

As indicated previously, the present procedure provides the following advantages over ultracentrifuging with optical detection:

Detection can be carried out in solutions which are not sufficiently transparent to the wavelengths of light used in optical detection. If the refractive index or absorption coefficient variations are too small to be useful, NMR detection would overcome this difficulty.

The chemical specificity of NMR detection permits partial or full chemical identification of sedimenting components. This includes differentiating between the several elements in a compound as well as differentiating the various chemical environments of those elements within the compound. The specificity can be further enhanced by isotopic or chemical labelling before analysis.

NMR detection can differentiate between molecules on the basis of rates of molecular motions as determined by NMR relaxation times. This ability could be useful for polydisperse mixtures of synthetic polymers.

True chemical images, i.e. maps of chemical composition as a function of position within an object, can be obtained through the NMR spectrum only for liquid samples, by conventional procedures. It should be recognized that living tissue is "liquid" in NMR terms since the contrast in images of living organisms is based in large part on the differing molecular states of water in different tissues.

Chemical imaging of solids has not been achieved in the prior art, and a preferred embodiment of the present invention achieves this important objective for the first time.

Chemical and tomographic structural analysis of a solid object is conducted by rotating the sample at high speed (about 1 to about 5 kHz) about an axis inclined at an acute angle with respect to the transverse magnetic field. Preferably the angle is 54.7°, the so-called "magic angle". Special RF pulse sequences may enhance the signal to noise ratio of the NMR signal.

In the analysis of most solid objects, the solid state intrinsic lineshapes are quite broad due to the anisotropic nature of the chemical shift, spin-spin coupling and quadrupole coupling. Magic angle spinning can reduce or even completely remove the broad lineshapes. It is also within the scope of the invention to utilize the line narrowing procedures disclosed in the above-mentioned U.S. Pat. Nos. 3,530,373; 3,530,374; 3,474,329 and 3,792,346.

The method of the present invention as applied to chemical imaging of solid objects finds utility in the non-destructive analysis of fabricated ceramic or polymeric products, woody, mineralized and composite materials. Information on the chemical composition of such an object throughout its internal volume could be obtained. For a polymeric object such information would help to obtain an understanding of areas penetrated by the polymer, the extent of cure of the polymer in various regions, the extent of cross-linking, presence of impurities, voids, inclusions and possible regions of breakdown due to chemical, mechanical or thermal stresses.

A medical application of the method would be the imaging of phosphorus in a sample of bone, tooth, or other mineralized tissue, from which information might be derived such as distribution of normal, depleted and excess bone mineral, locations of fluoride incorporation, and/or regions of stress and damage. To the extent that phosphate NMR signals are affected by factors such as states of normal and diseased bone tissue, rate of growth, incorporation of fluoride, excess or depletion of bone mineral and the like, it would be possible to obtain three-dimensional images of these states without destruction of the sample.

The advantages of the method of the present invention for imaging of solid objects in comparison to conventional NMR procedures are as follows:

The present invention provides high spatial resolution imaging of solid objects.

A chemical image of the object is also obtained simultaneously.

Only one rather the usual three magnetic field gradient coils is required.

It will of course be recognized that the high speed spinning of the sample requires that it be mechanically balanced and have sufficient mechanical strength to withstand the rotation.

Work has been done on silicone elastomers containing $29_{Si}$ which provides well resolved information on the siloxane network chains in the bulk material, network junctions, silica in filler particles, surface silanol groups on filler particles, and what are believed to be siloxane chains adsorbed on or otherwise interacting with filler particles. Obtaining such measurement in a spatially resolved manner assists in finding optimum compounding or curing procedures, or designing molds for testing or injection.

What is claimed is:

1. A method for non-destructive chemical and tomographic structural analysis of a moving object by nuclear magnetic resonance, comprising the steps of:
   (a) positioning a substantially nonmagnetic object to be analyzed within the field of a radio frequency excitation coil and the magnetic field of a nuclear resonance spectrometer, said object being of sufficiently low conductivity at the nuclear magnetic resonance frequency as to be substantially transparent to electromagnetic radiation of that frequency;
   (b) subjecting said object to periodic motion;
   (c) generating a transverse magnetic moment of the nucleus being observed, said generation being performed in a manner appropriate to the chemical and physical character of said object;
   (d) applying at least one phase encoding magnetic field gradient pulse in at least one specified direction to said moving object of sufficiently short duration that said object does not move appreciably while said pulse is on;
   (e) turning off said magnetic field gradient and detecting a free induction decay signal;
   (f) collecting said signal in a computer;
   (g) repeating steps (c), (d), (e) and (f) with appropriate increments in the intensities of the field gradient pulses in the manner of Fourier imaging, and at times corresponding to the same original position in the object; and
   (h) processing said signals by Fourier transformation whereby to obtain the chemical shift spectrum at various positions within the object.

2. The method of claim 1, wherein said object is substantially mechanically balanced, and said periodic motion thereof is rotation about an axis.

3. The method of claim 1, wherein said object is a solid.

4. The method of claim 1, wherein said object is a solution or suspension in which at least one component is to be analyzed.

5. The method of claim 2, wherein two magnetic field gradient pulses are applied by two coils in orthogonal directions of said object, thereby generating a chemical image with two spatial dimensions.

6. The method of claim 2, wherein two magnetic field gradient pulses are applied sequentially by one coil in a direction perpendicular to the axis of rotation of said object, with the time interval between the pulses being equal to the time required for said object to rotate by 90°, thereby generating a chemical image with two spatial dimensions.

7. The method of claim 2, wherein three magnetic field gradient pulses are applied by three coils in orthogonal directions of said object, thereby generating a chemical image with three spatial dimensions.

8. The method of claim 2, wherein three magnetic field gradient pulses are applied sequentially by one coil in a direction at an angle of approximately 54.7° from the axis of rotation of said object, wherein said object is rotated 120° between the first and second of said pulses, and wherein said object is rotated an additional 120° between the second and third of said pulses, thereby generating a chemical image with three spatial dimensions.

9. The method of claim 6, wherein a third spatial dimension is obtained by adding a field gradient pulse in a direction along the axis of rotation.

10. The method of claim 1, wherein the transverse magnetic moment of step (c) is caused by a cross polarization sequence.

11. The method of claim 1, wherein said step of detecting a free induction decay signal includes a line-narrowing procedure.

12. The method of claim 1, wherein step (c) comprises applying radio frequency excitation within said spectrometer, and including the step of applying additional radio frequency excitations so that the detected signals are indicative of relaxation times.

13. The method of claim 1, wherein step (c) comprises applying radio frequency excitation, and wherein said radio frequency excitation is a non-selective pulse.

14. The method of claim 1, wherein step (c) comprises applying radio frequency excitation, and wherein said radio frequency excitation is selective.

15. The method of claim 2, wherein said axis of rotation is oriented at an acute angle with respect to said transverse magnetic field.

16. The method of claim 15, wherein said acute angle is about 54.7°.

17. The method of claim 1, including the step of applying a 180° radio frequency pulse immediately after application of said at least one magnetic field gradient pulse in step (d), whereby to refocus any chemical shift evolution occurring prior to the 180° pulse.

18. The method of claim 1, wherein said object contains isotope-labelled molecules.

19. The method of claim 3, wherein said object is chosen from the class of polymeric, ceramic, woody, mineralized and composite materials.

20. The method of claim 3, wherein said object is chosen from the class consisting of animal bone, animal tooth, and mineralized tissue.

21. The method of claim 2, wherein the rotation of the object causes material in the object to sediment as in the manner of operation of a centrifuge or ultracentrifuge.

22. The method of claim 1, wherein said periodic motion is at least one of pulsatile flow, vortical flow, oscillatory flow, and constant flow motion.

23. The method of claim 1, wherein said motion is oscillatory.

24. The method of claim 1, wherein said chemical shift spectrum dimension of said signals is integrated, or otherwise processed by said computer, to remove chemical shift information so that the final data set contains spatial information only, whereby said final data set is processed by said computer to produce an image of the spatial extent of said object, and whereby said image contains no differentiation between chemical components within said object.

25. The method of claim 2, wherein the rate of rotation is about 1 to 5 kHz.

26. In a method for non-destructive chemical and tomographic structural analysis of a moving object by nuclear magnetic resonance, wherein a substantially non-magnetic object to be analyzed is positioned within the field of a radio frequency excitation coil and the magnetic field of a nuclear resonance spectrometer, said object being of sufficiently low conductivity at the nuclear magnetic resonance frequency as to be substantially transparent to electromagnetic radiation of that frequency, and said object is subjected to periodic motion, the improvement which comprises:
  (a) applying radio frequency excitation within said spectrometer synchronized in time with said motion of said object, thereby generating a transverse magnetization;
  (b) subsequently applying at least one magnetic field gradient pulse to said moving object of sufficiently short duration that said object does not move appreciably while said pulse is on;
  (c) turning off said at least one magnetic field gradient pulse and detecting a free induction decay signal;
  (d) collecting said signal in a computer;
  (e) repeating steps (a), (b), (c) and (d); and
  (f) processing said signals to obtain a readout by Fourier transformation, thereby obtaining an analysis of at least some chemical components on the basis of chemical shifts throughout a desired volume in said object.

* * * * *